United States Patent
Kang et al.

(10) Patent No.: US 7,109,585 B2
(45) Date of Patent: Sep. 19, 2006

(54) JUNCTION INTERCONNECTION STRUCTURES

(75) Inventors: Joo-Ah Kang, Seoul (KR); June Lee, Seoul (KR); In-Young Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/020,702

(22) Filed: Dec. 22, 2004

(65) Prior Publication Data

US 2006/0011993 A1    Jan. 19, 2006

(30) Foreign Application Priority Data

Jul. 14, 2004    (KR) ............... 10-2004-0054856

(51) Int. Cl.
*H01L 23/525*    (2006.01)
(52) U.S. Cl. .............. 257/758; 257/E23.146; 257/E23.171; 438/598
(58) Field of Classification Search .......... 257/211, 257/508, 775, E23.146, E23.171, E23.142, 257/208, 48; 438/98, 598, 599; 174/255, 174/261
See application file for complete search history.

(56) References Cited

U.S. PATENT DOCUMENTS

| | | | |
|---|---|---|---|
| 6,282,503 B1 | 8/2001 | Okazaki et al. | 703/15 |
| 6,330,705 B1 | 12/2001 | Matsushita et al. | 716/11 |
| 6,413,847 B1 * | 7/2002 | Yeh et al. | 438/598 |
| 6,586,815 B1 * | 7/2003 | Ohhashi | 257/529 |
| 6,680,501 B1 * | 1/2004 | Ito et al. | 257/296 |
| 6,717,267 B1 * | 4/2004 | Kunikiyo | 257/758 |
| 6,798,039 B1 | 9/2004 | Gillespie et al. | 257/531 |
| 2003/0132503 A1 * | 7/2003 | Yang | 257/529 |

FOREIGN PATENT DOCUMENTS

| | | |
|---|---|---|
| JP | 09-198428 | 7/1997 |
| JP | 2001-325317 | 11/2001 |
| JP | 2003-142589 | 5/2003 |
| KR | 2002-0052939 | 7/2002 |
| KR | 1020040018155 A | 3/2004 |

OTHER PUBLICATIONS

Notice to File a Response/Amendment to the Examination Report corresponding to Korean Patent Application No. 10-2004-0054856 mailed Feb. 28, 2006.

* cited by examiner

*Primary Examiner*—Eugene Lee
*Assistant Examiner*—William F. Kraig
(74) *Attorney, Agent, or Firm*—Myers Bigel Sibley & Sajovec, PA

(57) ABSTRACT

An integrated circuit device includes a semiconductor substrate having an interlayer insulating layer thereon and a first junction block embedded in the interlayer insulating layer. The first junction block includes a first plurality of conductive junction traces located side-by-side within the interlayer insulating layer and a corresponding first plurality of pairs of conductive vias connected to opposite ends of respective ones of the first plurality of conductive junction traces. The first junction block also includes a dummy conductive trace located adjacent the first plurality of conductive junction traces and a pair of dummy conductive vias connected to opposite ends of the dummy junction trace. The integrated circuit device further includes a plurality of upper metallization traces routed on the interlayer insulating layer. The upper metallization traces are configured to electrically connect with the first plurality of pairs of conductive vias and maintain the dummy conductive trace and the pair of dummy conductive vias in an unused and electrically floating condition.

12 Claims, 22 Drawing Sheets

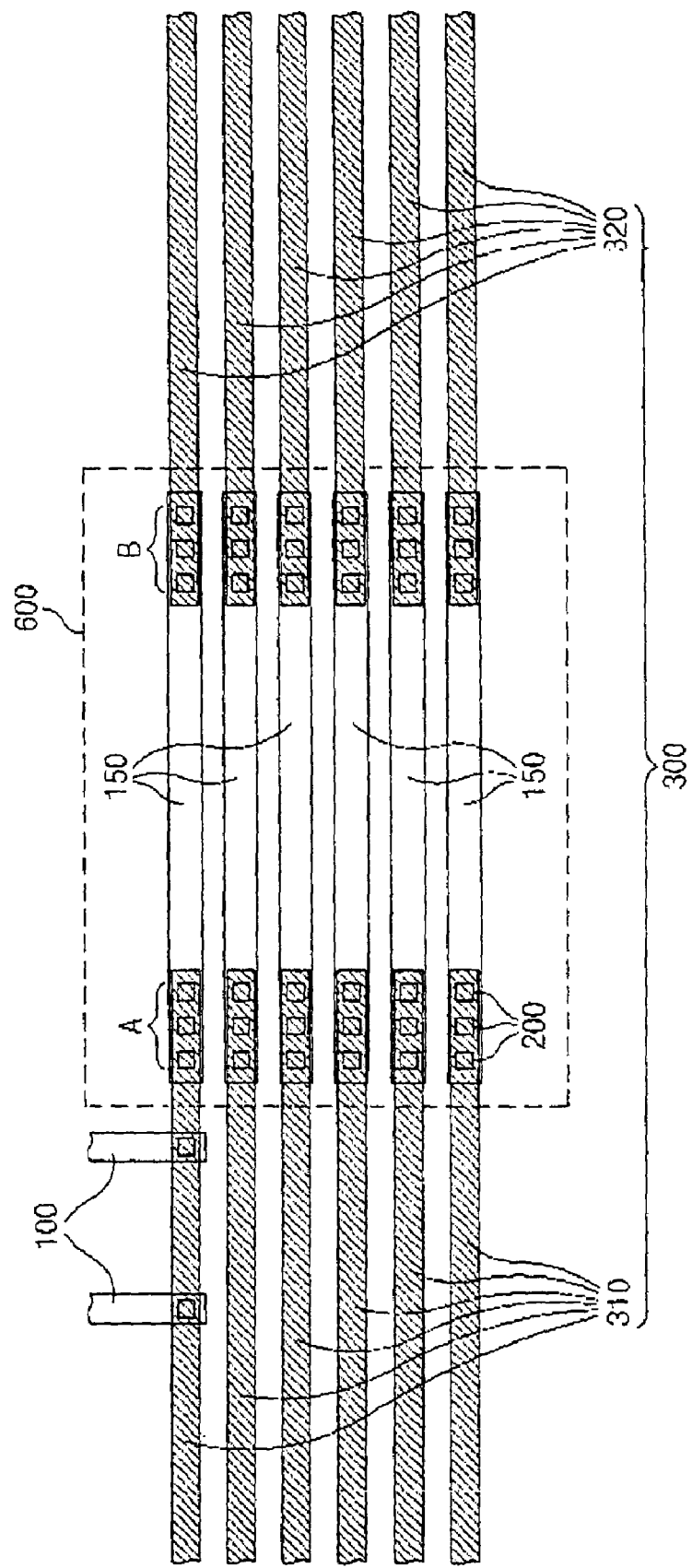

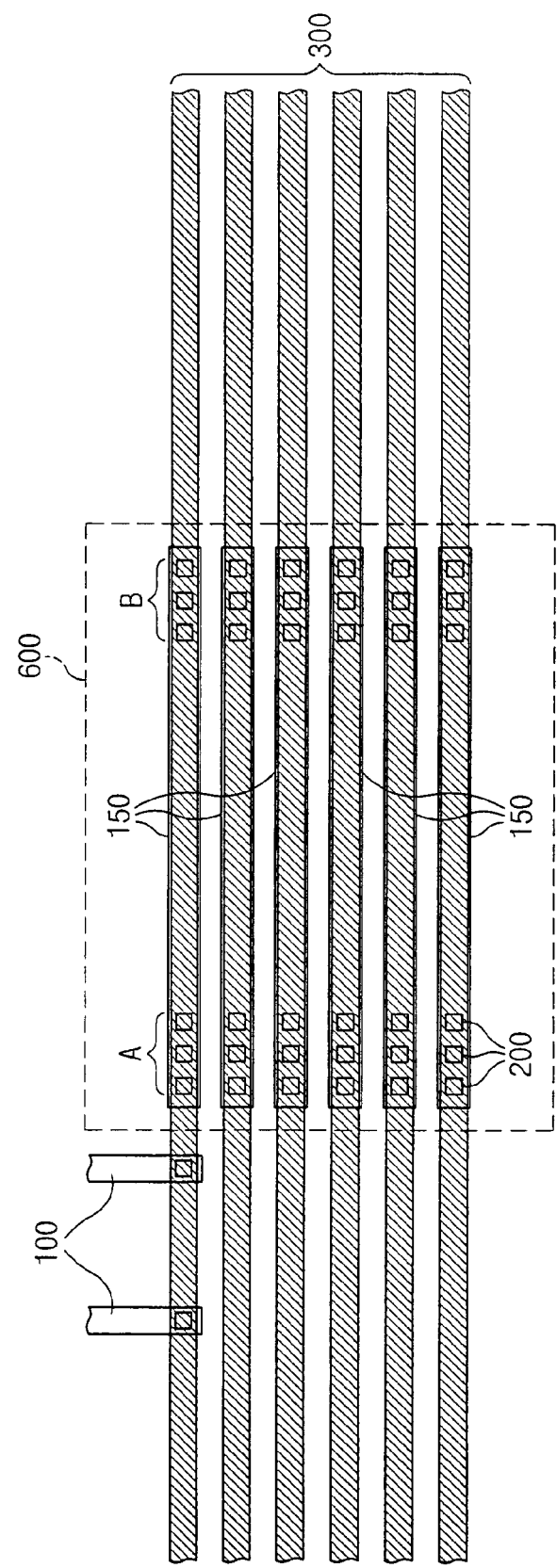

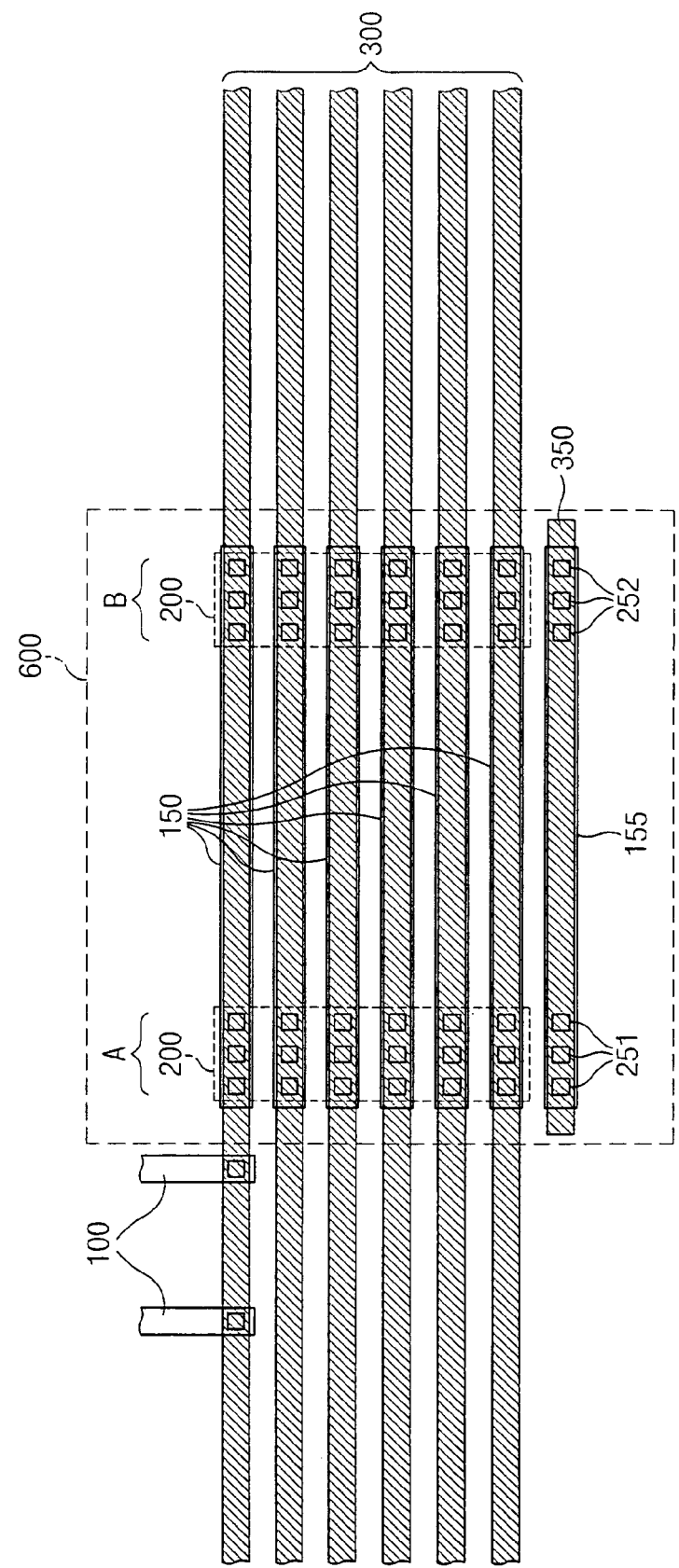

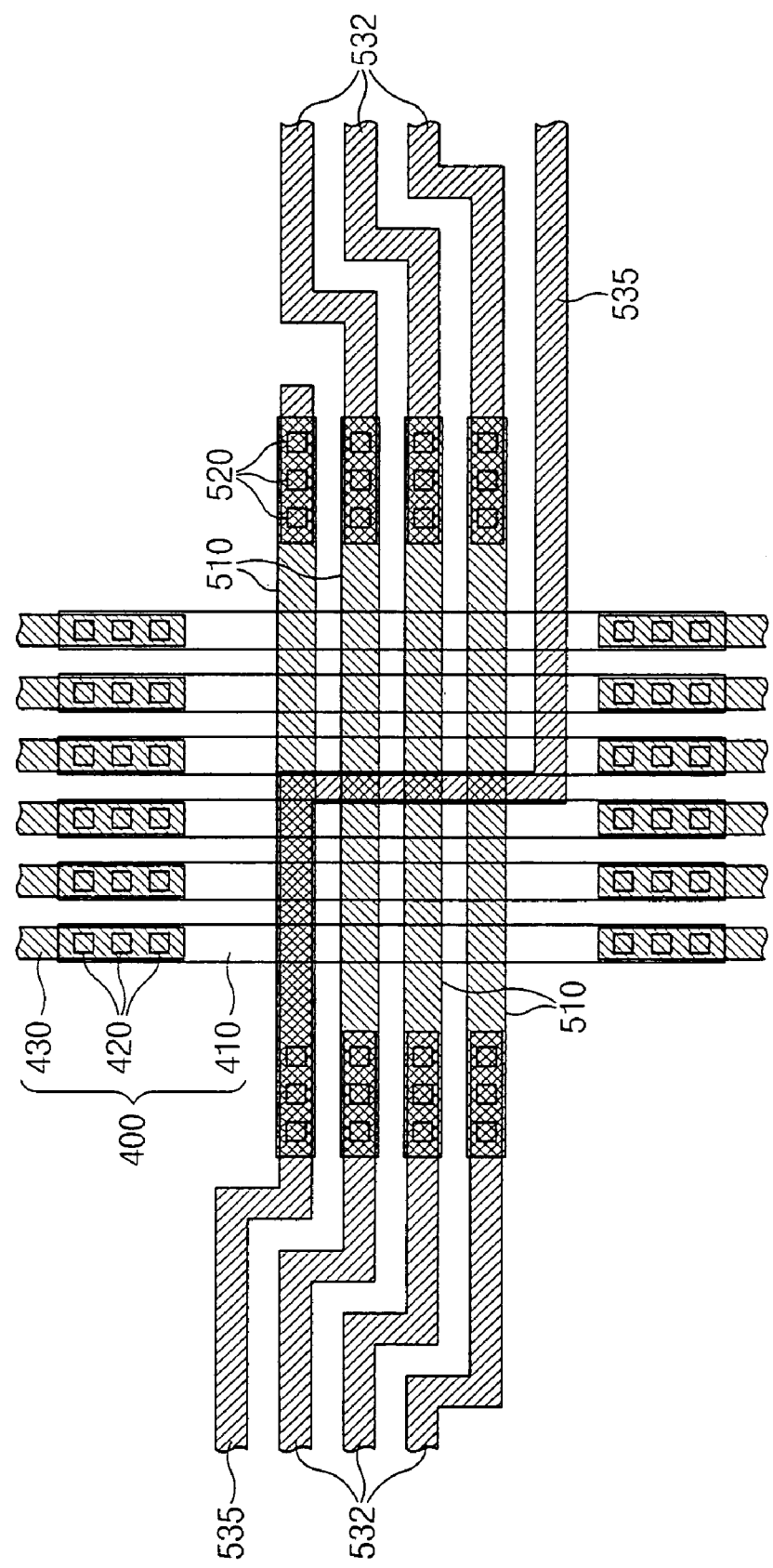

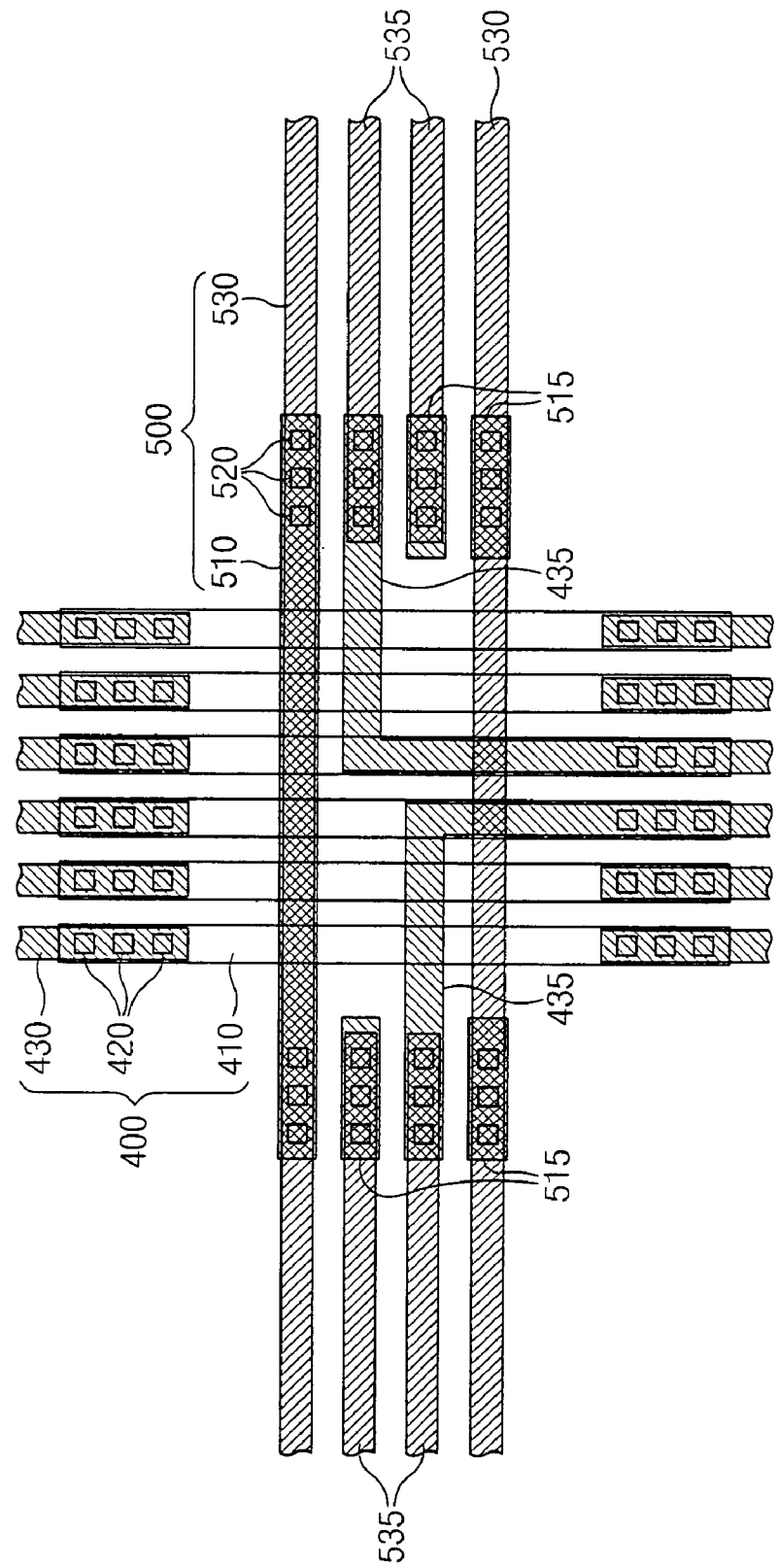

US 7,109,585 B2

JUNCTION INTERCONNECTION STRUCTURES

CLAIM OF PRIORITY

This application claims priority from Korean Patent Application No. 2004-54856, filed on Jul. 14, 2004, the contents of which is hereby incorporated by reference herein in its entirety.

FIELD OF THE INVENTION

The present invention relates to semiconductor devices, and more specifically, to interconnection structures in semiconductor devices.

BACKGROUND OF THE INVENTION

Semiconductor devices may include interconnection structures for electrically connecting electronic components (e.g., transistors, capacitors and resistances) to form desired electric circuits. The interconnection structures may include a plurality of conductive interconnections, also known as "traces." For example, an interconnection structure may include lower traces arranged on a lower metallization layer of the semiconductor substrate, upper traces arranged on an upper metallization layer above the lower traces, and conductive vias in a region between the upper and lower metallization layers that electrically connect the lower traces on the lower layer to the upper traces on the upper layer. Conventional interconnection structures are described in "Silicon Processing for the VLSI Era: Volume 2—Process Integration", pages 84–296 of Chapter 3 and 4, by Stanley Wolf, published on 1990 edition by Lattice Press.

FIG. 1 is a flowchart illustrating conventional operations for designing, fabricating and revising interconnection structures in semiconductor devices.

Referring now to FIG. 1, a circuit layout for a semiconductor device is determined (block S1), and one or more photomasks are fabricated based on the determined circuit layout (block S2). The circuit layout may include the routing of traces on each layer of a semiconductor substrate. The semiconductor device is then fabricated using the photomask(s) (block S3). More specifically, a photolithography process is performed to copy the determined circuit layout from each photomask to a layer of the semiconductor substrate. The fabricated semiconductor device is then examined for quality (block S4). Devices passing a predetermined examination standard may be sold. If technical defects are found, a request may be made to revise the arrangement and/or routing of the traces so as to correct the defects. The revision (block S5) may also be performed to improve the performance of the semiconductor device.

FIGS. 2A and 2B are schematic diagrams illustrating conventional methods of revising interconnection structures in semiconductor devices.

As shown in FIG. 2A, lower traces 10 (on a lower metallization layer of the substrate) are connected to upper traces 30 (on an upper metallization layer of the substrate) by conductive vias 20 arranged in a predetermined region of the semiconductor substrate between the upper and lower layers. In particular, FIG. 2A illustrates an embodiment where first and second lower traces 11 and 12 are respectively connected to one 31 of the upper traces 30 by first and second vias 21 and 22. In this embodiment, the upper traces 30 include first to sixth upper traces 31 to 36.

Referring now to FIG. 2B, if the layout is revised such that a second one 12' of the lower traces 10' is to be electrically connected to a seventh one 37 of the upper traces 30', it may be necessary to add the seventh upper trace 37, extend the second lower trace 12' on the lower layer to vertically overlap with the seventh upper trace 37 on the upper layer, and move the via 22' to the overlapping position. As such, the routing of the lower traces 10', the vias 20' and the upper traces 30' may require revision. If such a revision is requested, it may be necessary to fabricate a new photomask for each of the affected layers, which may increase the costs of device fabrication.

SUMMARY OF THE INVENTION

According to some embodiments of the present invention, an integrated circuit device may include a semiconductor substrate having an interlayer insulating layer thereon and a first junction block embedded in the interlayer insulating layer. The first junction block may include a first plurality of conductive junction traces located side-by-side within the interlayer insulating layer and a corresponding first plurality of pairs of conductive vias connected to opposite ends of respective ones of the first plurality of conductive junction traces. The first junction block may further include a dummy conductive trace located adjacent the first plurality of conductive junction traces and a pair of dummy conductive vias connected to opposite ends of the dummy conductive trace. The integrated circuit device may also include a plurality of upper metallization traces routed on the interlayer insulating layer. The upper metallization traces may be configured to electrically connect with the first plurality of pairs of conductive vias and maintain the dummy conductive trace and the pair of dummy conductive vias in an unused and electrically floating condition.

In some embodiments, the plurality of upper metallization traces may be configured to electrically connect with the first plurality of pairs of conductive vias such that at least one of the plurality of upper metallization traces is hanging and/or disconnected.

In other embodiments, the plurality of upper metallization traces may be configured to electrically connect with the first plurality of pairs of conductive vias to form parallel connections between respective upper metallization traces and conductive junction traces.

In some embodiments, the plurality of upper metallization traces may be configured to electrically connect with the first plurality of pairs of conductive vias to form series connections between respective upper metallization traces and conductive junction traces.

In other embodiments, multiple conductive vias may be connected to opposite ends of respective ones of the first plurality of conductive junction traces.

In some embodiments, the first junction block may further include a plurality of dummy conductive traces located adjacent the first plurality of conductive junction traces and a corresponding second plurality of pairs of conductive vias connected to opposite ends of respective ones of the plurality of dummy conductive traces. The plurality of upper metallization traces may be further configured to maintain the plurality of dummy conductive traces and the second plurality of pairs of dummy conductive vias in an unused and electrically floating condition.

According to some embodiments of the present invention, a method of designing an integrated circuit device on a semiconductor substrate having an interlayer insulating layer thereon may include generating a first mask to provide a first plurality of conductive junction traces located side-by-side within the interlayer insulating layer and a dummy conductive trace located adjacent the first plurality of conductive junction traces. The method may further include generating a second mask to provide a first plurality of pairs of conductive vias corresponding to the first plurality of conductive junction traces and a pair of dummy conductive vias. The first plurality of pairs of conductive vias may be connected to opposite ends of respective ones of the first plurality of conductive junction traces, and the pair of dummy conductive vias may be connected to opposite ends of the dummy conductive trace. The method may also include generating a third mask to provide a plurality of upper metallization traces routed on the interlayer insulating layer. The upper metallization traces may be configured to electrically connect with the first plurality of pairs of conductive vias and maintain the dummy conductive trace and the pair of dummy conductive vias in an unused and electrically floating condition.

In some embodiments, the method may include revising the third mask to configure the plurality of upper metallization traces to electrically connect with the first plurality of pairs of conductive vias such that at least one of the upper metallization traces is hanging and/or disconnected.

In other embodiments, generating a third mask may include generating the third mask to configure the plurality of upper metallization traces to electrically connect with the first plurality of pairs of conductive vias to form a series connection between respective upper metallization traces and conductive junction traces.

In further embodiments, generating a third mask may include generating the third mask to configure the plurality of upper metallization traces to electrically connect with the first plurality of pairs of conductive vias to form a parallel connection between respective upper metallization traces and conductive junction traces.

BRIEF DESCRIPTION OF THE DRAWINGS

FIGS. 4A to 7A are schematic diagrams illustrating interconnection structures according to some embodiments of the present invention.

FIGS. 4B to 7B are perspective views illustrating semiconductor devices having interconnection structures according to some embodiments of the present invention.

FIGS. 14 to 16 are schematic diagrams illustrating revised interconnection structures in semiconductor devices having three interconnection layers according to some embodiments of the present invention.

DETAILED DESCRIPTION OF EMBODIMENTS OF THE INVENTION

Figure 1:
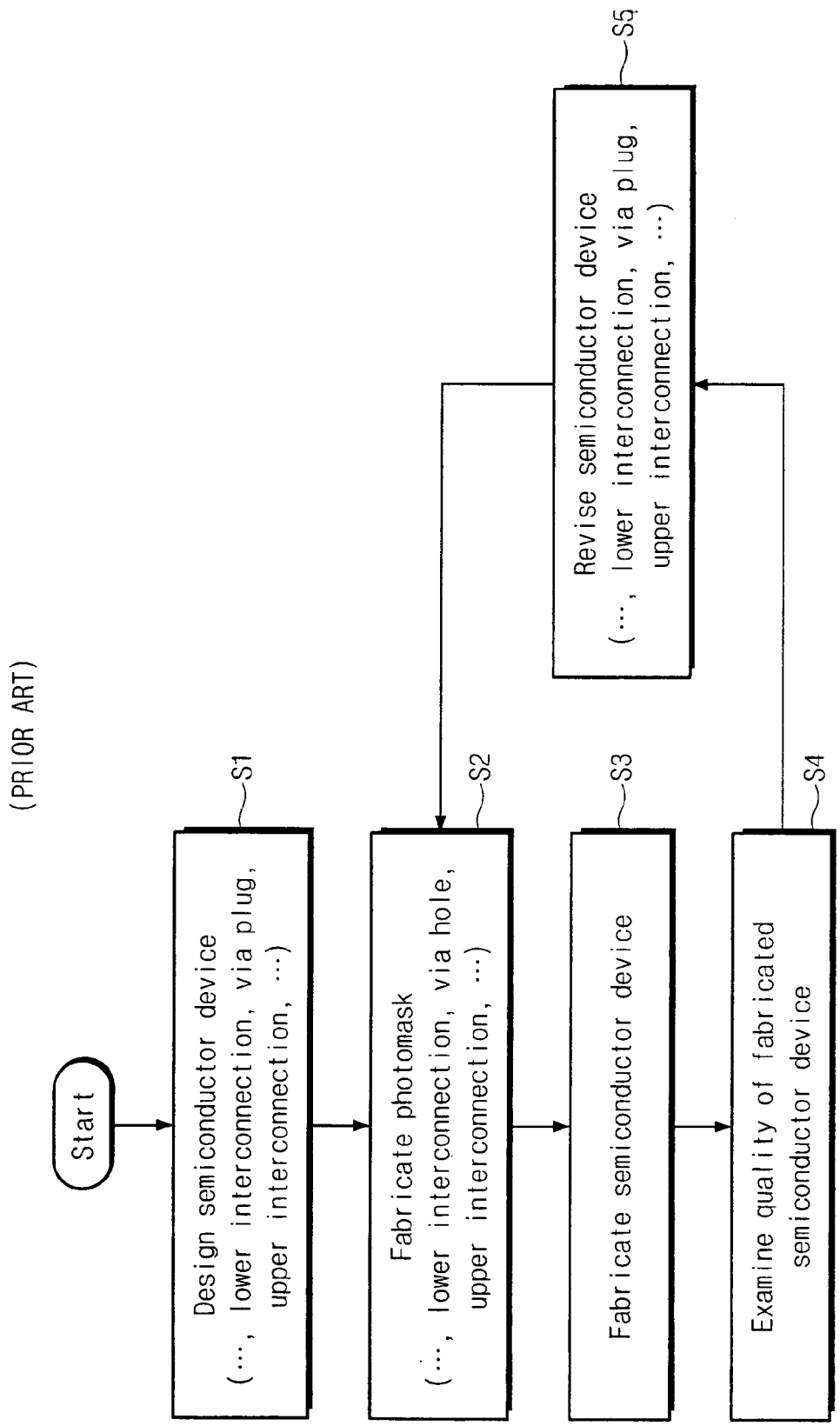
FIG. 1 is a flowchart illustrating conventional operations for designing, fabricating and revising interconnection structures in semiconductor devices.

The present invention will be described more fully hereinafter with reference to the accompanying drawings in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Furthermore, relative terms, such as above, may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "above" is intended to encompass both above and beneath in this situation.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
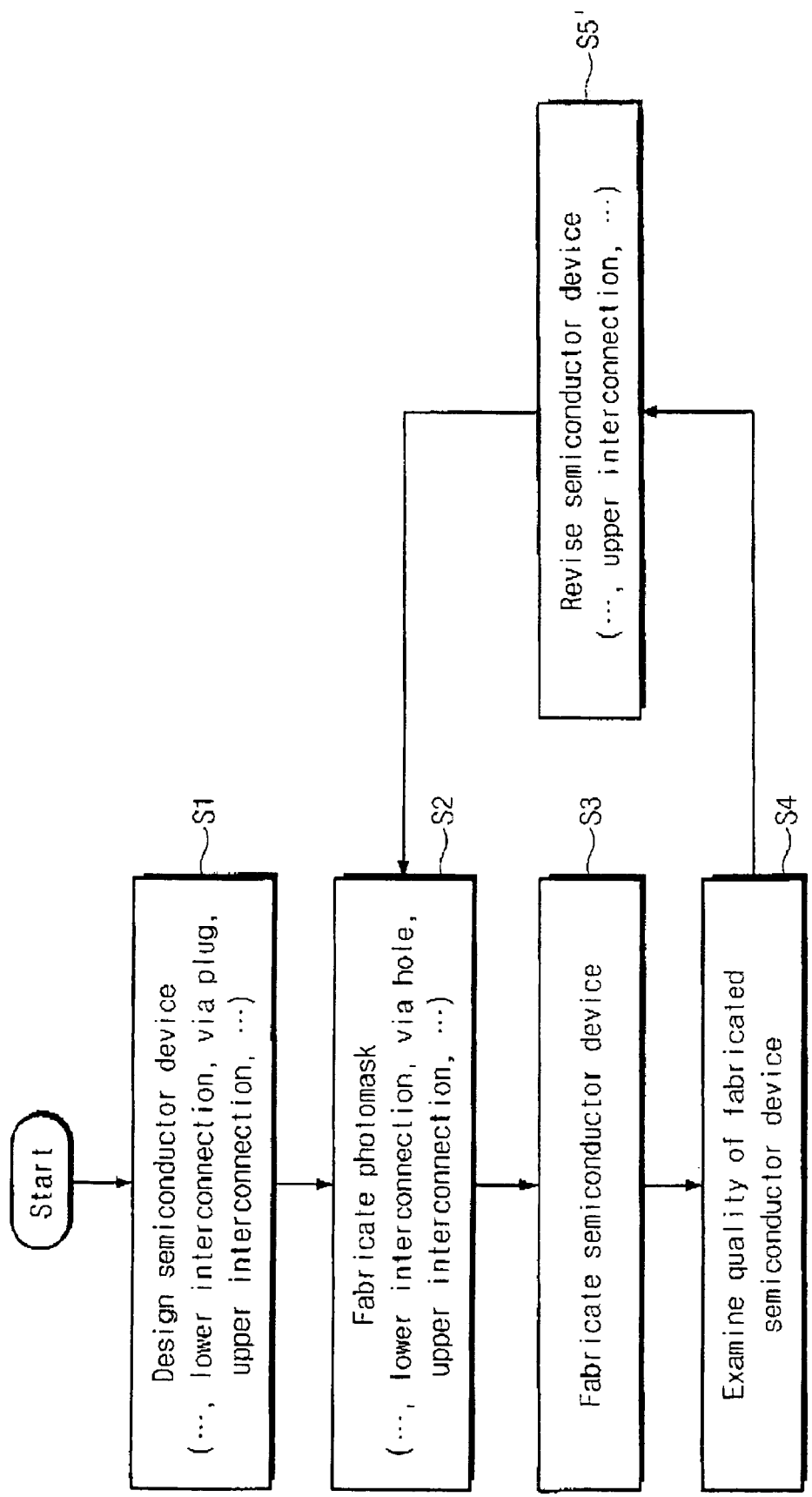
FIG. 3 is a flowchart illustrating operations for designing and revising interconnection structures in semiconductor devices according to some embodiments of the present invention.

FIG. 3 is a flowchart illustrating operations for designing and revising interconnection structures in semiconductor devices according to some embodiments of the present invention.

Referring to FIG. 3, the circuit layout for a semiconductor device to be formed on a semiconductor substrate having an interlayer insulating layer is determined (block S1). The circuit layout may include the configuration of an interconnection structure including the arrangement and routing of lower metallization traces, upper metallization traces and conductive vias. The lower traces may be arranged on a lower metallization layer of the semiconductor substrate. Vias may be arranged to vertically overlap with the lower traces in predetermined regions of the substrate between the lower layer and upper layers. The upper traces may be arranged on an upper metallization layer of the semiconductor substrate to overlap with the vias. A series of photomasks are then fabricated based on the determined circuit layout for each layer of the semiconductor device (block S2). Since each photomask may include the circuit layout for only one layer of the semiconductor device, at least three photomasks may be needed to create the interconnection structure.

Still referring to FIG. 3, after fabricating the semiconductor device using the photomasks (block S3), the quality of the semiconductor device is examined (block S4). As described above, the photomask may be revised in order to improve performance of the semiconductor device and/or correct any technical defects that are discovered upon examination. The quality information gained from examination of the semiconductor device is used to revise the photomask for the upper traces (block S5').

More particularly, in accordance with some embodiments of the present invention, the photomask providing the routing of the upper traces of an interconnection structure may be revised without altering the photomasks providing the arrangement of the lower traces and the vias (block S5'). To accomplish this, a trace junction block may be embedded in the interlayer insulating layer below the upper traces, and the conductive vias may be arranged in a region of the substrate between the upper and lower layers to electrically connect the upper traces with the trace junction block.

The trace junction block may be a subsidiary interconnection structure including a first plurality of conductive junction traces located side-by-side within the interlayer insulating layer and at least one dummy conductive trace located adjacent the first plurality of junction traces. A first plurality of pairs of conductive vias may be connected to opposite ends of respective ones of the first plurality of conductive junction traces, and a pair of dummy conductive vias may be connected to opposite ends of the dummy trace. The upper traces may be configured to electrically connect with the first plurality of pairs of conductive vias and maintain the dummy trace and the pair of dummy conductive vias in an unused and electrically floating condition. Since the layout of the trace junction block may be included in the initial design of the circuit layout (block S1), the routing of the upper traces may be revised to provide a desired interconnection structure without altering the routing of the lower traces and the vias.

FIGS. 4A to 7A are schematic diagrams illustrating interconnection structures according to some embodiments of the present invention. FIGS. 4B to 7B are perspective views illustrating semiconductor devices including interconnection structures according to some embodiments of the present invention.

Figure 4B:
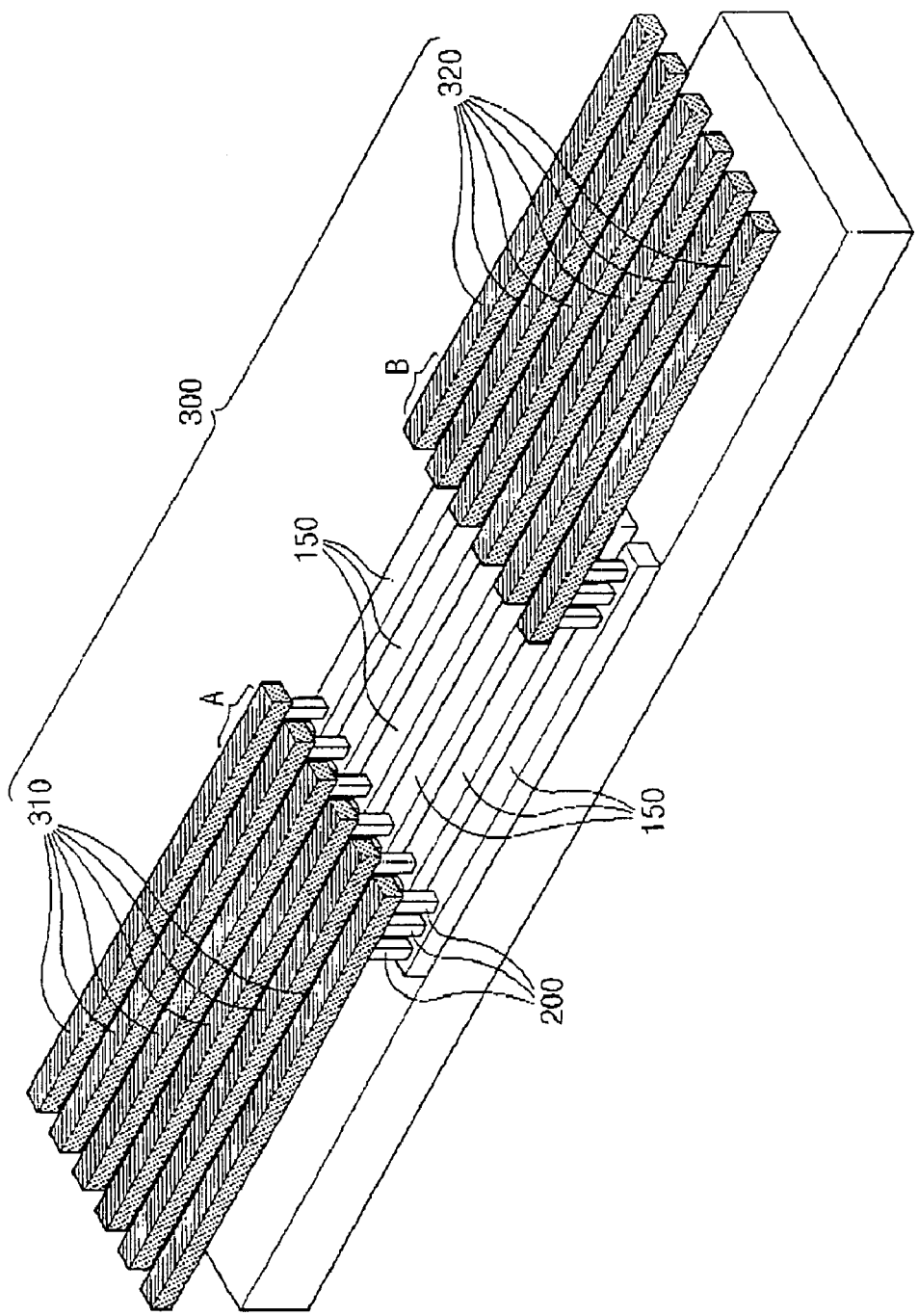

Referring to FIGS. 4A and 4B, lower traces 100 are arranged on a lower metallization layer of the semiconductor substrate. Conductive vias 200 are arranged at predetermined regions of the substrate between the lower layer and upper layers to overlap with the lower traces 100. Upper traces 300 are formed to overlap with the vias 200 on an upper metallization layer of the substrate.

In accordance with the present invention, the semiconductor substrate includes at least one trace junction block 600, including one or more conductive junction traces 150 arranged in the junction block 600. As described above, the routing of the junction traces 150 is determined when the layout of the lower traces 100 is designed.

Still referring to FIGS. 4A and 4B, the conductive vias 200 are arranged to be electrically connected with opposite ends of the junction traces 150. For convenience, the positions of the vias 200 connected to both ends of the junction traces 150 are illustrated as a first position A and a second position B in the junction block 600.

The upper traces 300 are routed over the first and second positions A and B. In some embodiments, the upper traces 300 may include left upper traces 310 and right upper traces 320. The left upper traces 310 may be routed over the first position A, and the right upper traces 320 may be routed over the second position B. Accordingly, the vias 200 may electrically connect the junction traces 150 with the left upper traces 310 and the right upper traces 320 in series.

Figure 5B:
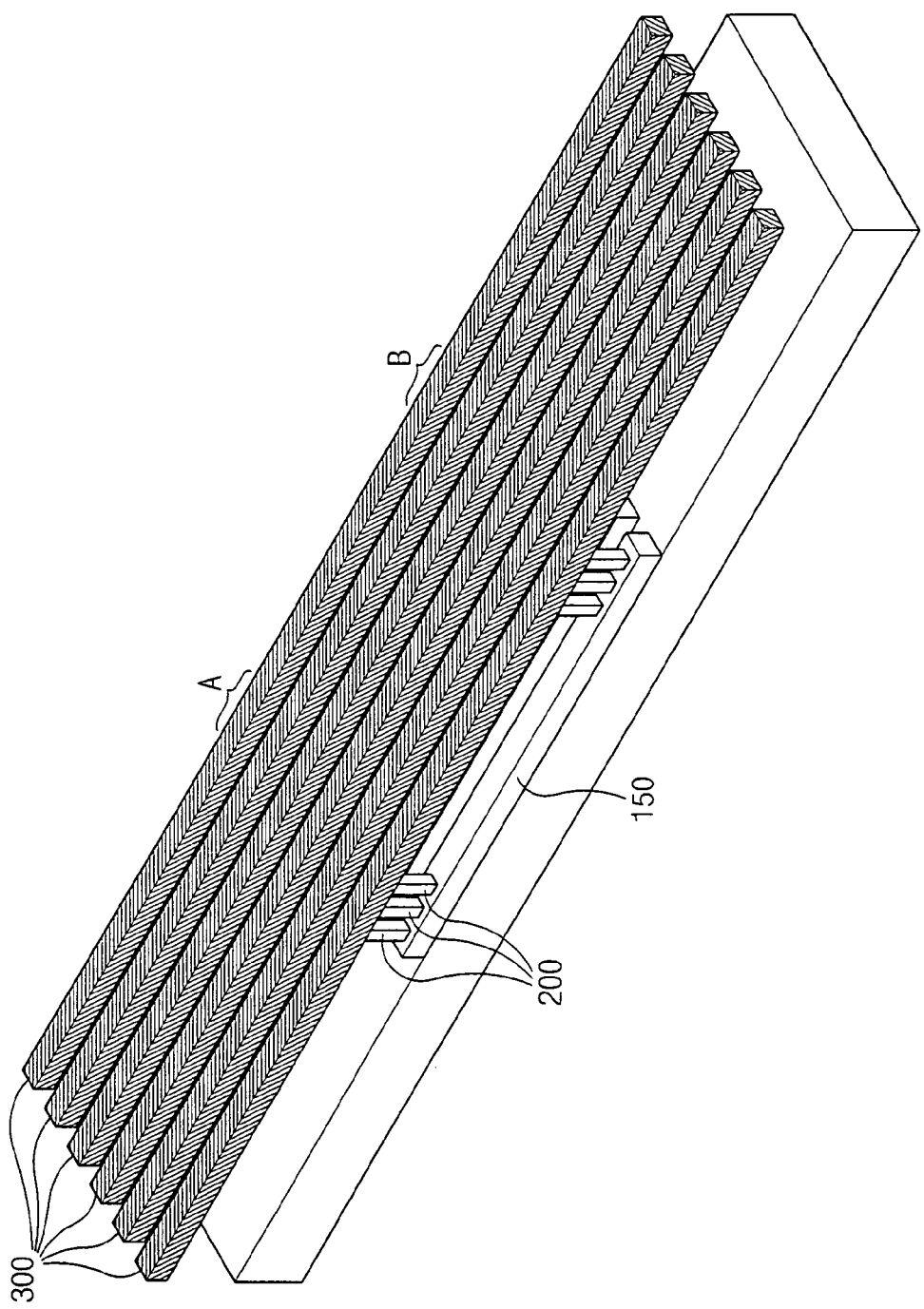

Referring to FIGS. 5A and 5B, in other embodiments according to the present invention, each of the upper traces 300 may routed over both the first and second positions A and B. Accordingly, the vias 200 may electrically connect the junction traces 150 with the upper traces 300 in parallel.

As described above, a plurality of trace junction blocks 600 may be arranged in the semiconductor substrate. As such, some of the junction blocks 600 may include the parallel connection structure of FIG. 5A, and other junction blocks 600 may include the serial connection structure of FIG. 4A. The connection structure of the upper traces 300 may be determined according to whether the junction block 600 is arranged for input or output of signals.

Referring to FIGS. 6A, 6B, 7A and 7B, in further embodiments according to the present invention, a dummy interconnection structure may be included in the trace junction block 600. The dummy interconnection structure may be routed so as to maintain an electrically floating condition. As such, at least one dummy junction trace 155 may be arranged at one side of the junction block 600, and a first dummy via 251 and a second dummy via 252 may be arranged at both ends of the dummy junction trace 155. Similar to the relationship between the vias 200 and the first and second positions A and B, the first dummy via 251 may be located in a position corresponding to the first position, and the second dummy via 252 may be located in a position corresponding to the second position B.

Figure 6A:
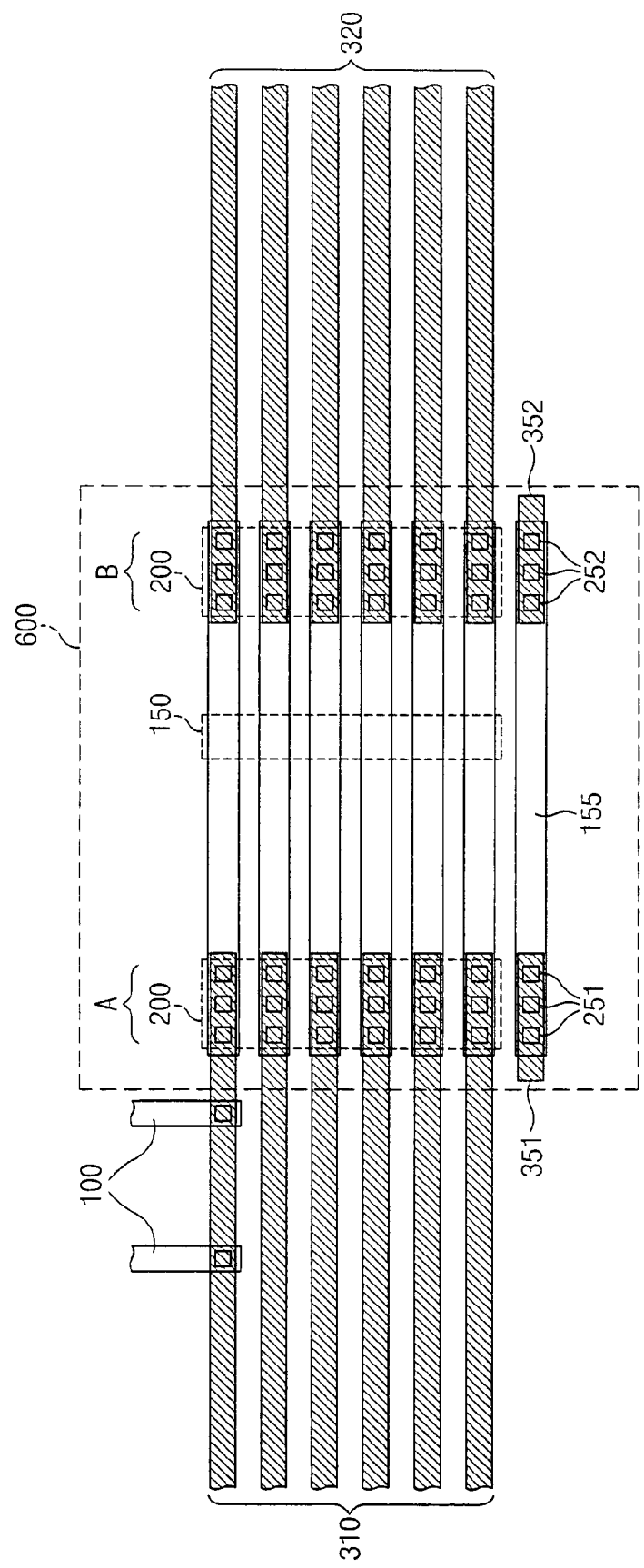
Figure 6B:
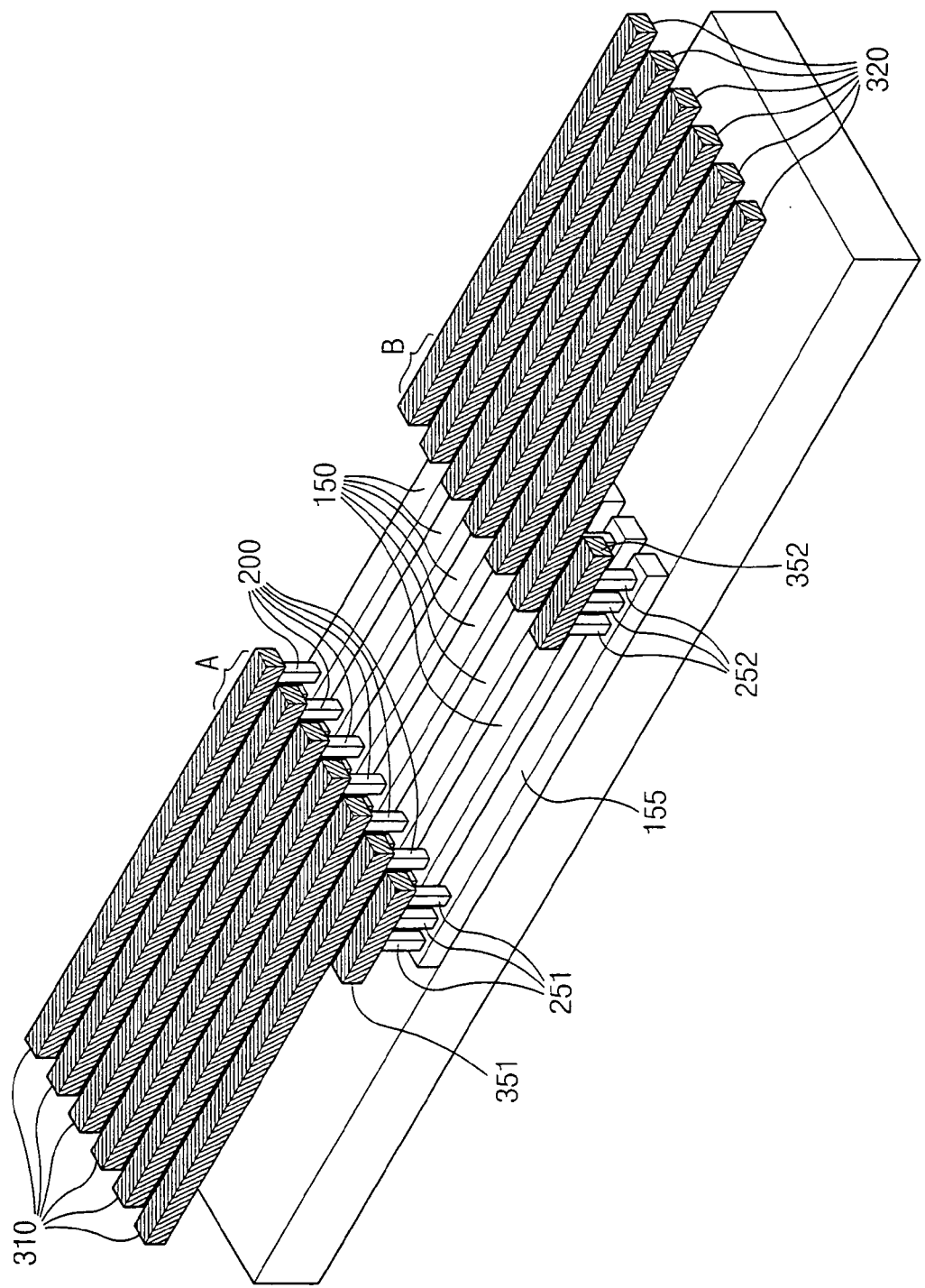

As shown in FIGS. 6A and 6B, a first dummy upper trace 351 and a second dummy upper trace 352 are routed over the first dummy via 251 at position A and the second dummy via 252 at position B. The left and right upper traces 310 and 320 extend outside of the junction block 600, and preferably, may be electrically connected to other conductive patterns (e.g., lower traces 100) on different metallization layers of the substrate. In contrast, the first and second dummy upper traces 351 and 352 are electrically connected to only the dummy junction trace 155 by the first and second dummy vias 251 and 252. Accordingly, a dummy structure including the dummy junction trace 155, the first and second dummy vias 251 and 252, and the first and second dummy upper traces 351 and 352 is electrically floating, as described above. As illustrated in FIGS. 6A and 6B, the dummy structure may have a serial connection structure.

Figure 7B:
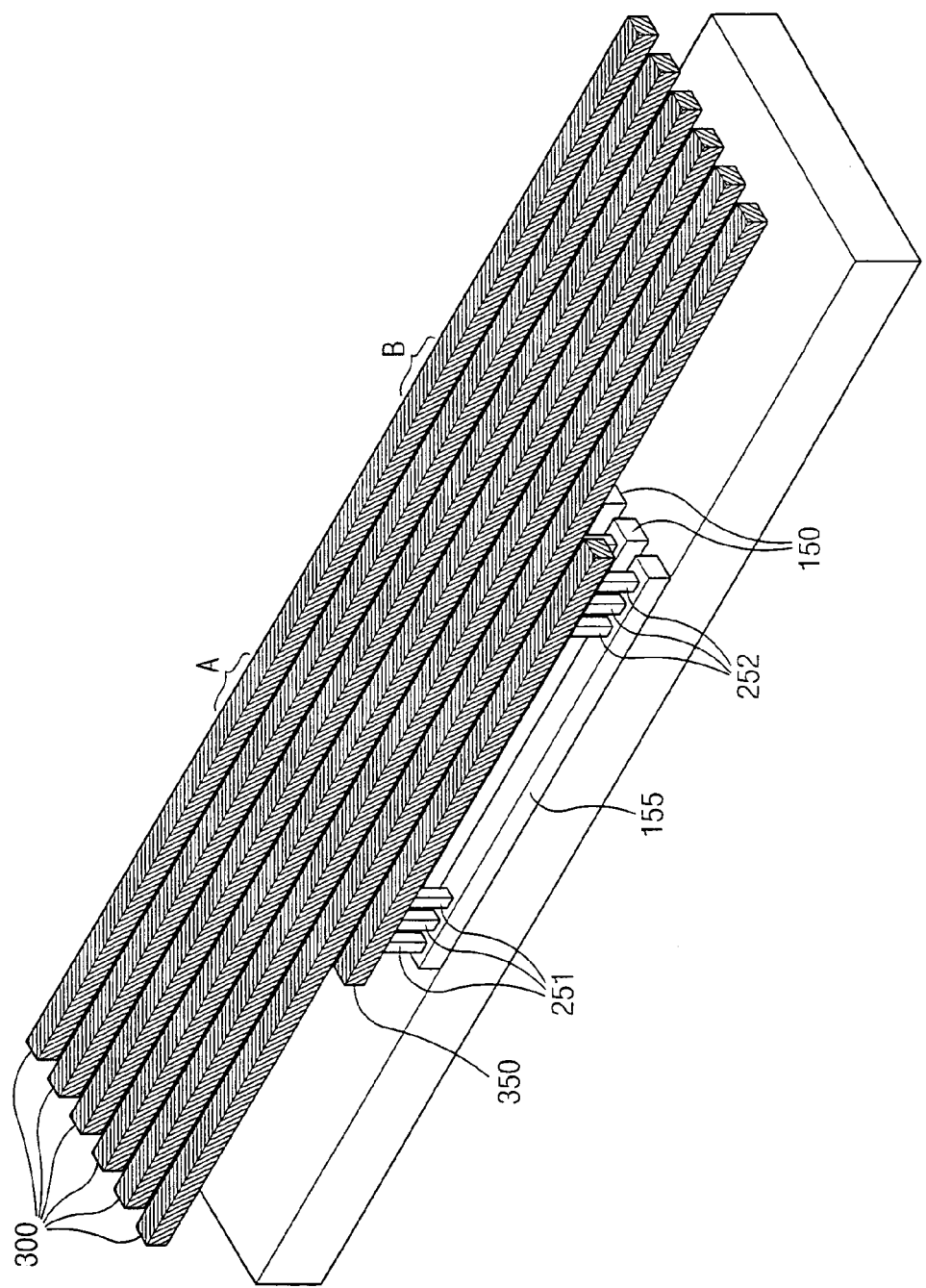

Referring to FIGS. 7A and 7B, a dummy upper trace 350 is routed over the first and second dummy vias 251 and 252. Also, the dummy upper trace 350 is arranged in the junction block 600 such that it is electrically connected to only the dummy junction trace 155 by the first and second dummy vias 251 and 252. Accordingly, a dummy structure including the dummy junction trace 155, the first and second dummy vias 251 and 252, and the dummy upper trace 350 is also electrically floating. As illustrated in FIGS. 7A and 7B, the dummy structure may have a parallel connection structure.

Figure 8A:
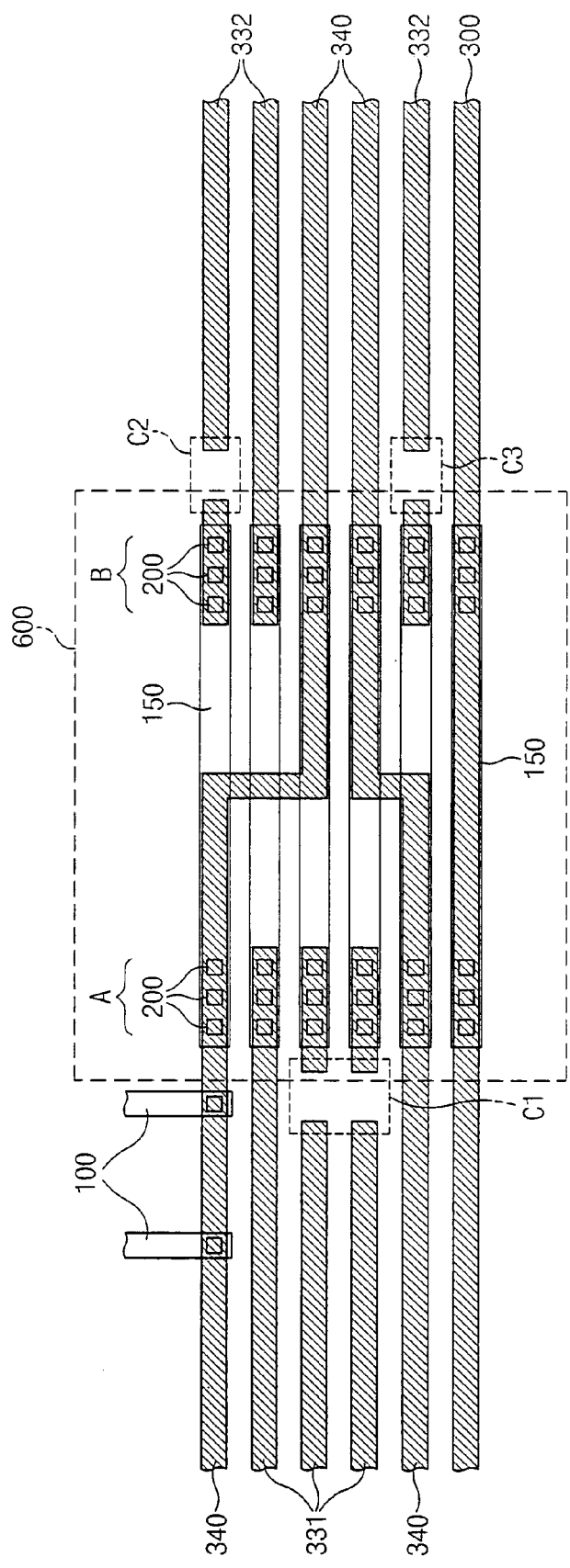
FIGS. 8A and 9A are schematic diagrams illustrating revised interconnection structures according to some embodiments of the present invention.
Figure 8B:
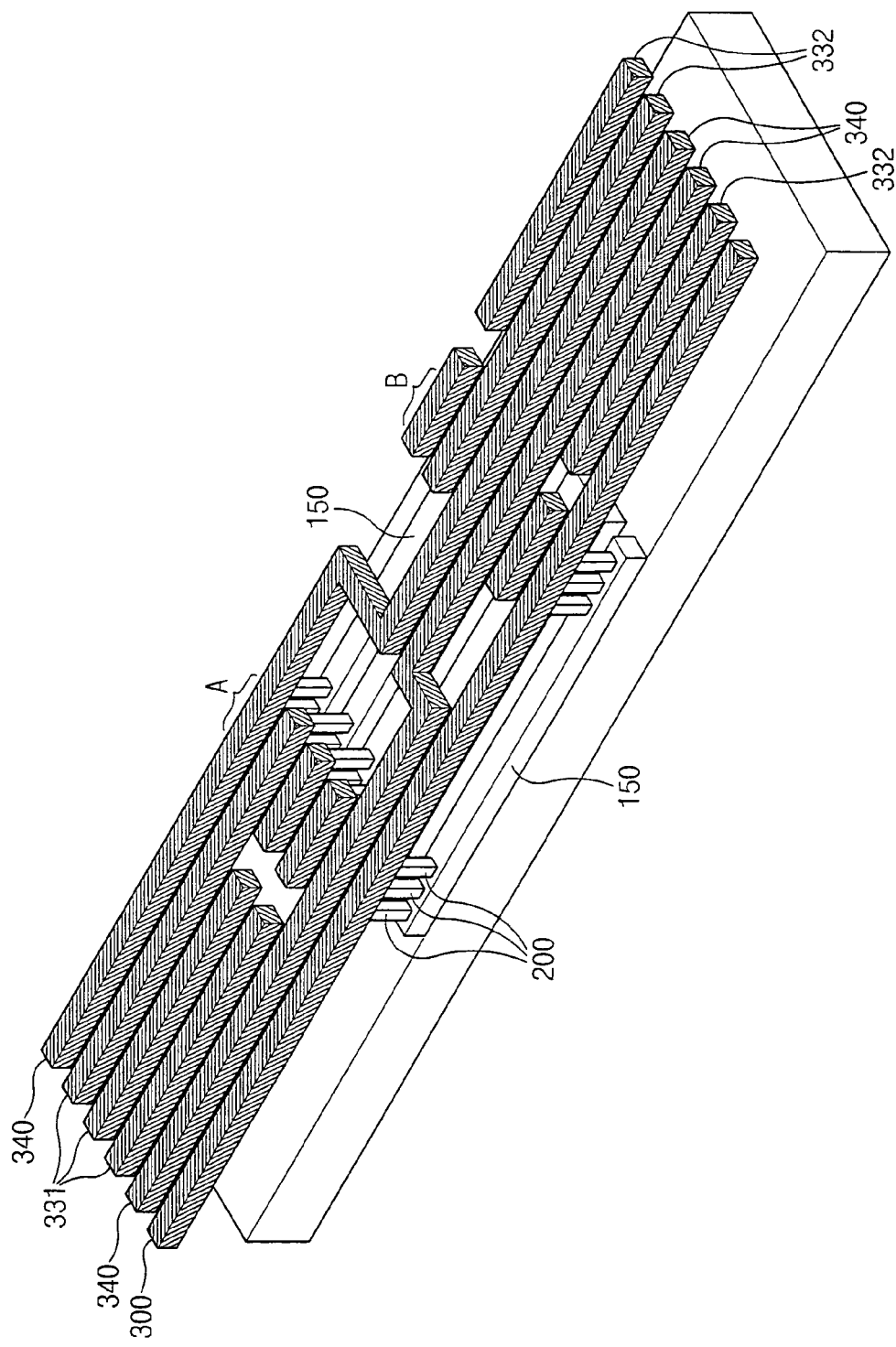
FIGS. 8B and 9B are perspective views illustrating semiconductor devices with revised interconnection structures according to some embodiments of the present invention.
Figure 9A:
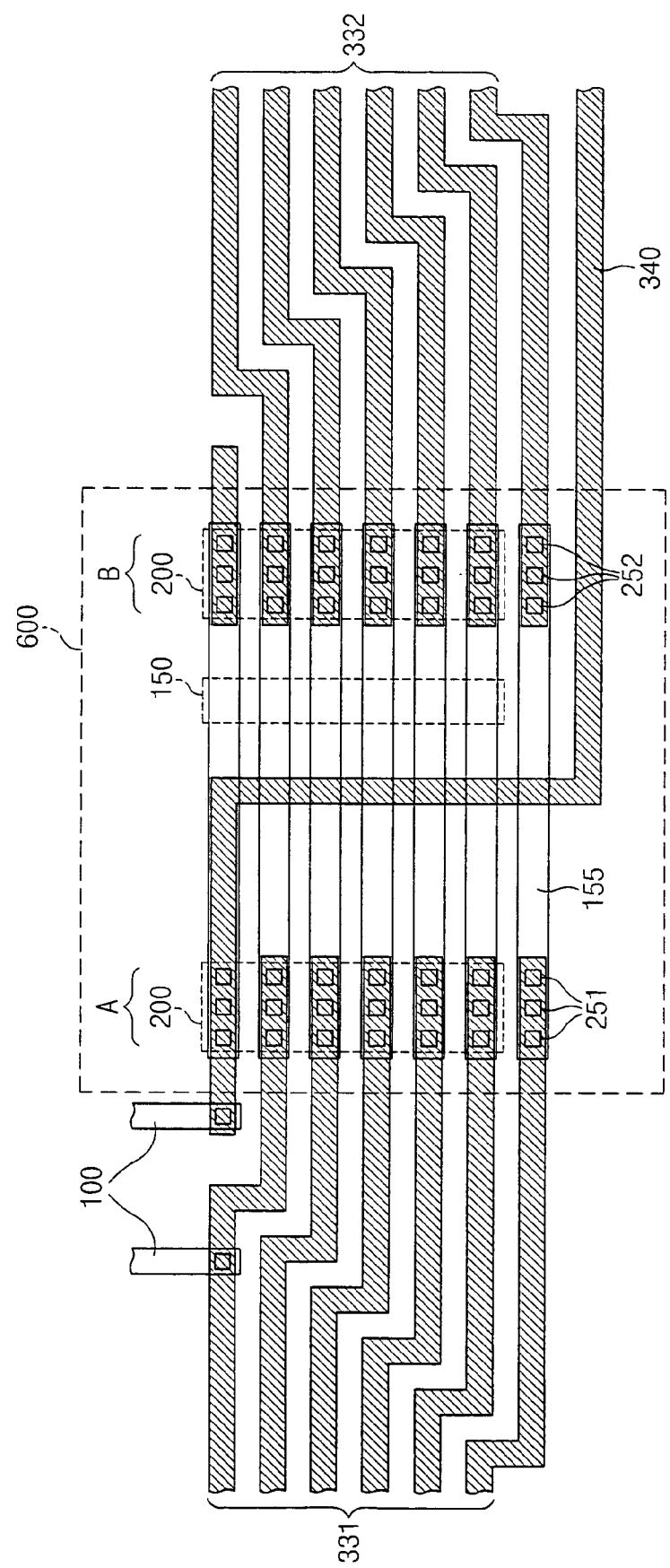
Figure 9B:
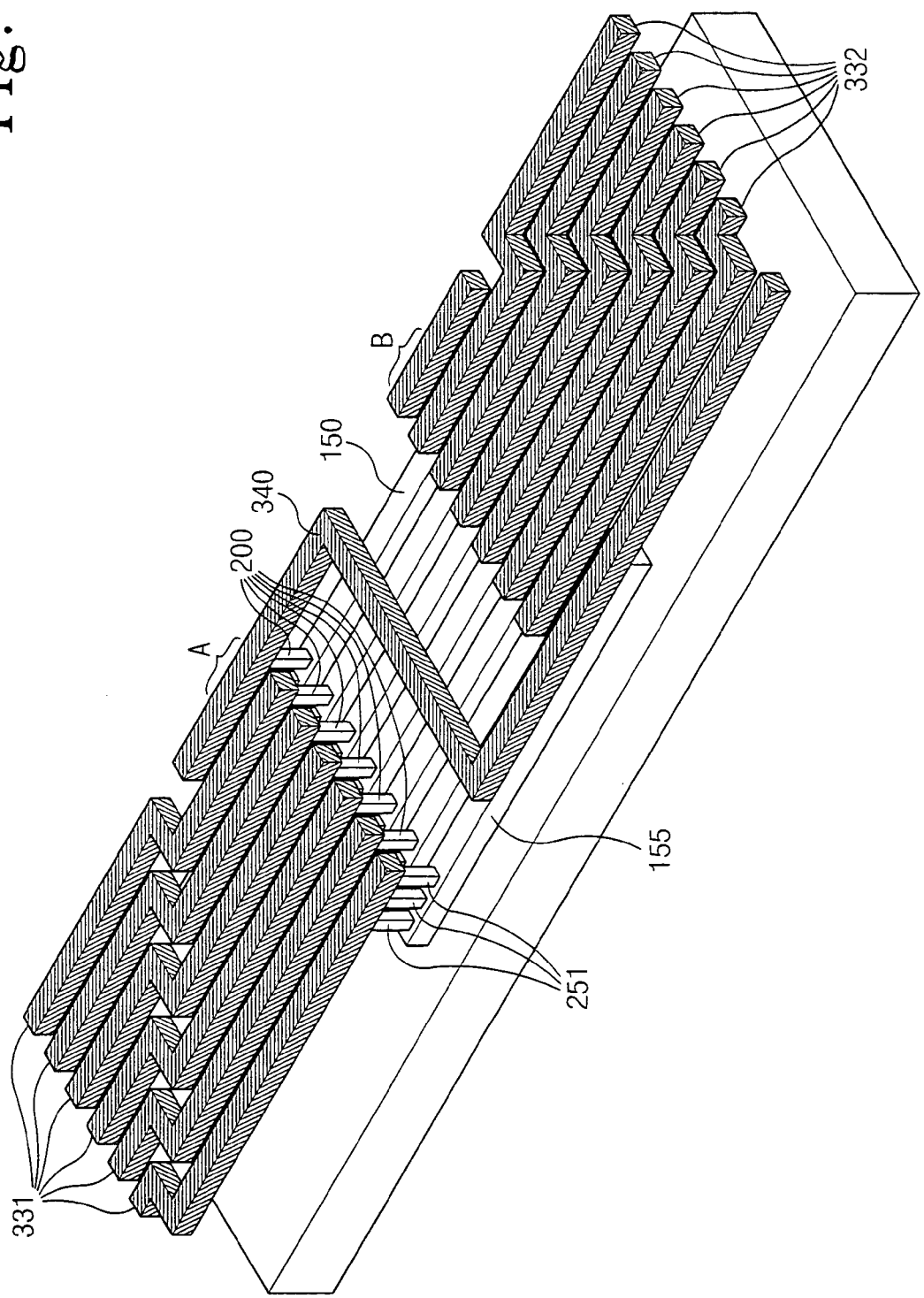

FIGS. 8A and 9A are schematic diagrams illustrating revised interconnection structures according to some embodiments of the present invention. FIGS. 8B and 9B are perspective views illustrating semiconductor devices which include the revised interconnection structures. FIGS. 8A and 8B illustrate revisions which may be applicable to the embodiments of FIGS. 4A–B and 5A–B. FIGS. 9A and 9B illustrate revisions which may be applicable to the embodiments of FIGS. 6A–B and 7A–B.

Referring now to FIGS. 8A and 8B, a revised interconnection structure according to some embodiments of the present invention includes upper traces 300 routed on an upper metallization layer of the semiconductor substrate. The upper traces 300 include left upper traces 331 and right upper traces 332 electrically connected by a trace junction block 600 on a lower metallization layer of the substrate, similar to the configuration of FIG. 4A. Some of the upper traces 300 are re-routed to form revised interconnections 340. As such, some of the left and right upper traces 331 and 332 may be disconnected from each other, and "hanging" portions of the left and right upper traces 331 and 332 may be present. The revised interconnections 340 are routed in an unused area of the upper metallization layer between the left upper traces 331 and the right upper traces 332 so as to cross over some of the junction traces 150. Accordingly, some of the upper traces 300 are not affected by the routing of the revised interconnections 340.

However, as the revised interconnections 340 are electrically connected to two of the junction traces 150, four of the left and right upper traces 331 and 332 (which are also connected to the junction traces 150) are electrically connected with each other. Accordingly, in order to form the revised interconnections 340 and electrically isolate the desired traces, four of the left and right upper traces 331 and 332 are disconnected from the junction traces 150 at predetermined regions C1, C2 and C3.

Figure 2A:
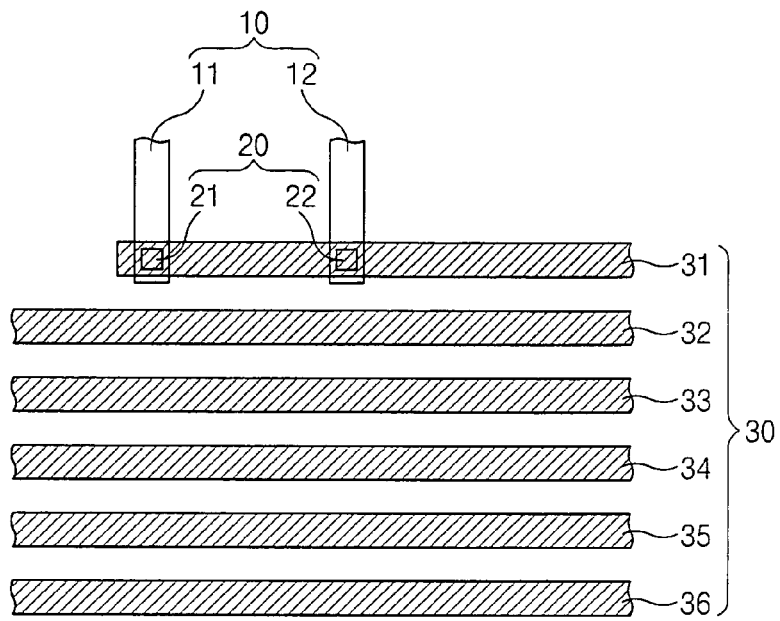
FIGS. 2A and 2B are schematic diagrams illustrating conventional methods of revising interconnection structures in semiconductor devices.

Referring to FIGS. 9A and 9B, as described above, the upper traces 300 include the left upper traces 331 and the right upper traces 332 which are electrically connected by the junction block 600. Prior to revision, lower traces 100 are configured to electrically connect with a first one of the left upper traces 331, similar to the conventional layout of FIG. 2A. In order to revise the layout such that a desired one of the lower traces 100 is electrically connected to a different one of the right upper traces, each of the left upper traces 331 and the right upper traces 332 are re-routed. Each of the left upper traces 331 and the right upper traces 332 are electrically connected to an adjacent junction trace 150, and the first left upper trace is disconnected between the connection points of the lower traces 100, leaving a hanging first left upper trace. As such, a last one of the left and right upper traces 331 and 332 are electrically connected with the dummy interconnection structure. In other words, the upper traces are configured such that the last one of the left and right upper traces 331 and 332 may be electrically connected to opposing ends of the dummy junction trace 155. A revised interconnection 340 connects the desired one of the lower traces 100 to a different one of the right upper traces.

Figure 2B:
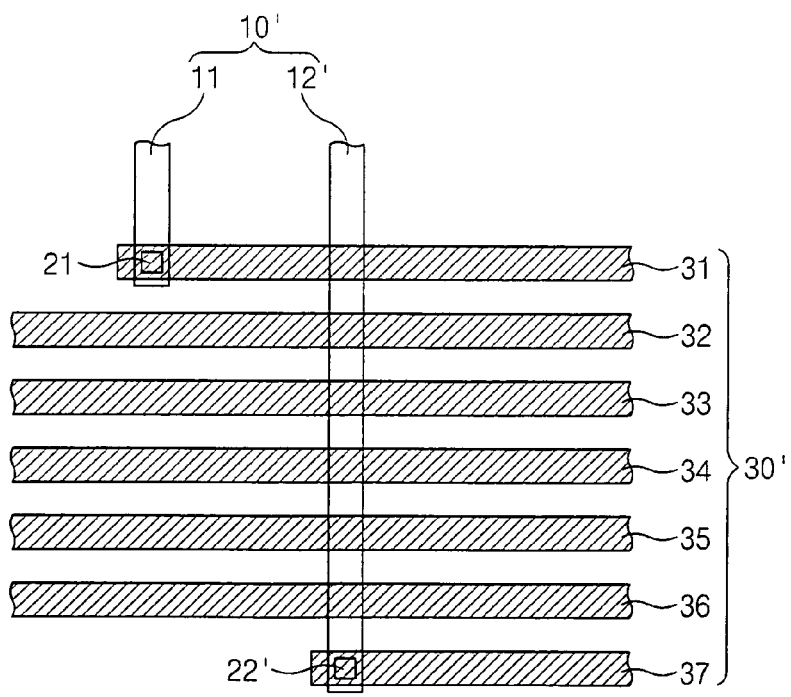

As the dummy structure may provide an unused or spare route for connecting the left and right upper traces 331 and 332, it may be easier to revise the layout of the semiconductor device. In addition, since the left and right upper traces 331 and 332 are connected with the junction traces 150 and the dummy junction trace 155 (which are on a lower metallization layer), the revised interconnection 340 may be routed in an unused area of the upper layer between the left and right upper interconnections 331 and 332. As the revised interconnection 340 crosses over the junction traces 150 and the dummy junction trace 155 to connect one of the lower traces 100 to the right upper traces, the embodiments of FIGS. 9A and 9B may be similar to the conventional revised layout of FIG. 2B. However, compared with the conventional techniques of FIG. 2B, embodiments of the present invention provide a similar revised interconnection structure while only altering the routing of the upper traces 300. In other words, revisions to the upper traces 300 may be performed without affecting the routing of the lower traces 100 and or the vias 200.

Additional junction structures according to some embodiments of the present invention may be used in conjunction with more than two interconnection layers. FIGS. 10 to 13 are schematic diagrams illustrating interconnection structures in semiconductor devices having three interconnection layers according to some embodiments of the present invention.

Referring to FIGS. 10 to 13, a plurality of first junction traces 410 are routed on a lower metallization layer of the semiconductor substrate. First conductive vias 420 are arranged to overlap with predetermined regions of the first junction traces 410. A plurality of second traces 430 are routed over the first vias 420 on a different metallization layer. The first junction traces 410, the first vias 420, and the second traces 430 may respectively correspond to the junction traces 150, the conductive vias 200 and the upper traces 300 described with reference to FIGS. 4A and 4B. In other words, the lower interconnection structure 400 includes the first junction traces and second traces 410 and 430 connected in series by the first vias 420.

In some embodiments of the present invention, a plurality of lower interconnection structures 400 may be included. A plurality of upper interconnection structures 500 may be arranged to cross over the lower interconnection structures 400. The upper interconnection structure 500 includes second junction traces 510, second conductive vias 520 and third traces 530. The second junction traces 510 may correspond to the junction traces 150, the second vias 520 may correspond to the vias 200, and the third traces 530 may correspond to the upper traces 300 as described with reference to FIGS. 5A and 5B. The second junction traces 510 may be routed on the same metallization layer as the second traces 430, and may be similar in thickness and material. As such, the routing of both the second junction traces 510 and the second traces 430 may be designed simultaneously. Accordingly, the layout for the second traces 430 and the second junction traces 510 may be provided by the same photomask.

Figure 10:
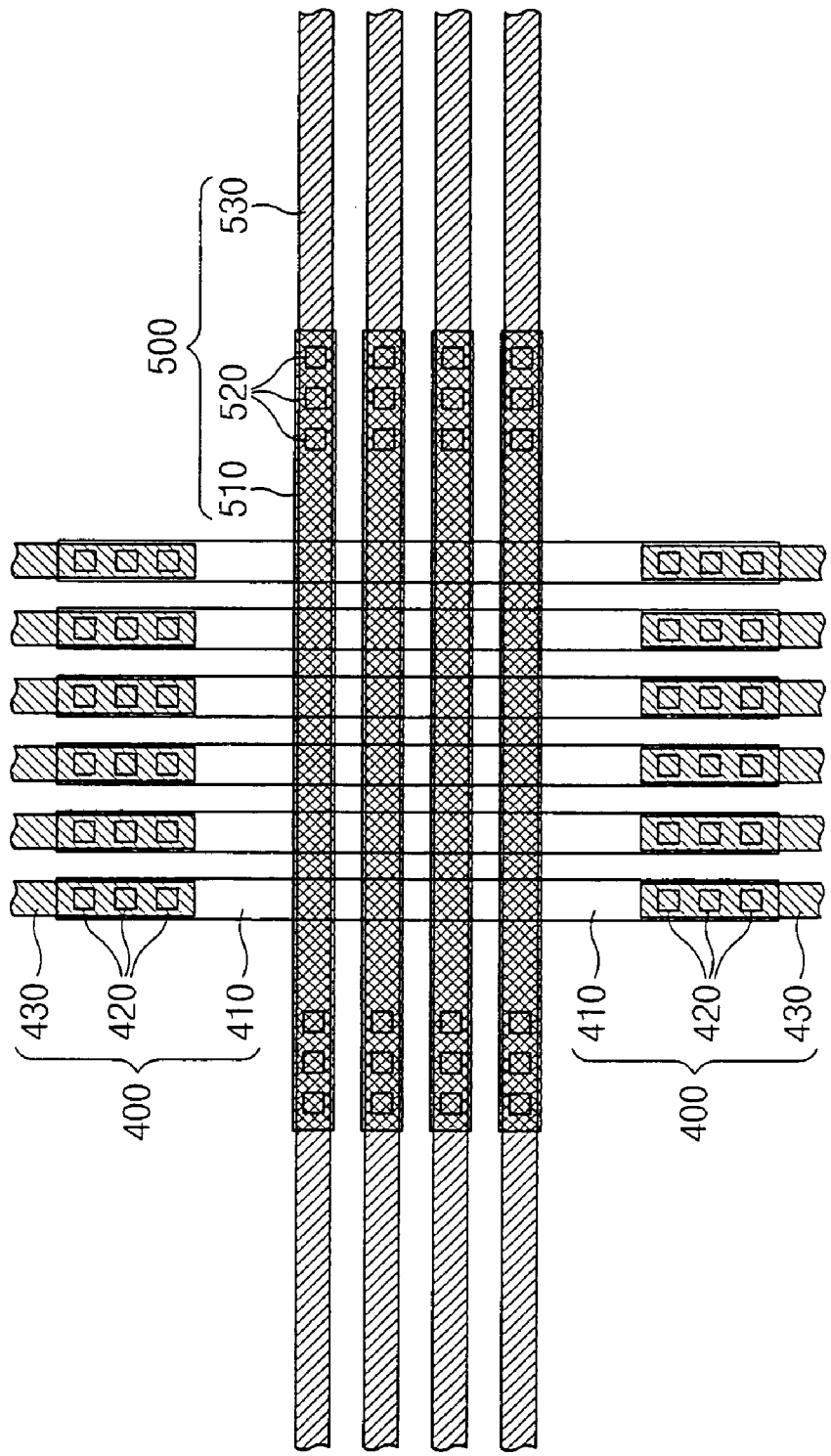
FIGS. 10 to 13 are schematic diagrams illustrating interconnection structures in semiconductor devices having three interconnection layers according to some embodiments of the present invention.
Figure 11:
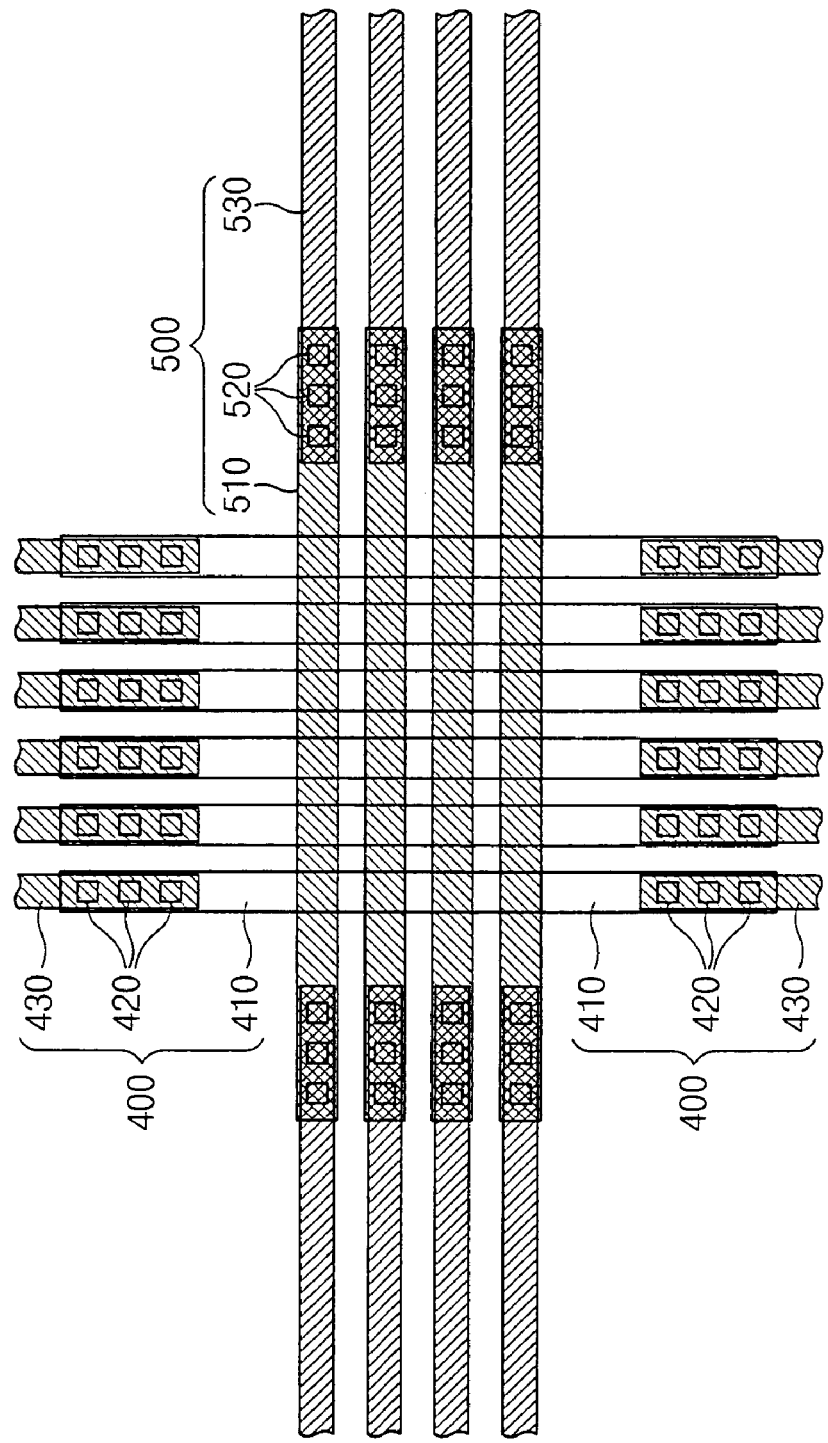
Figure 12:
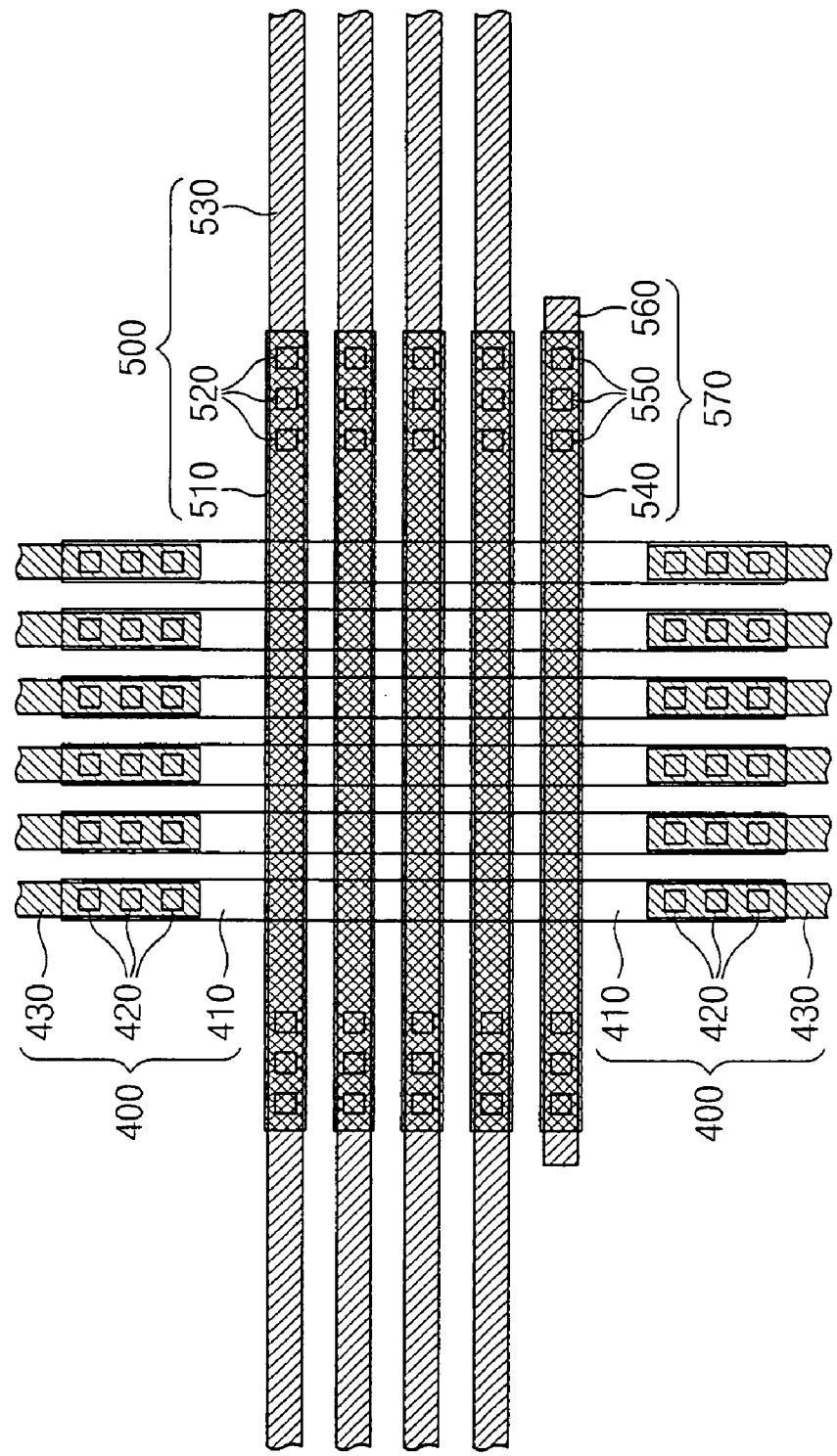
Figure 13:
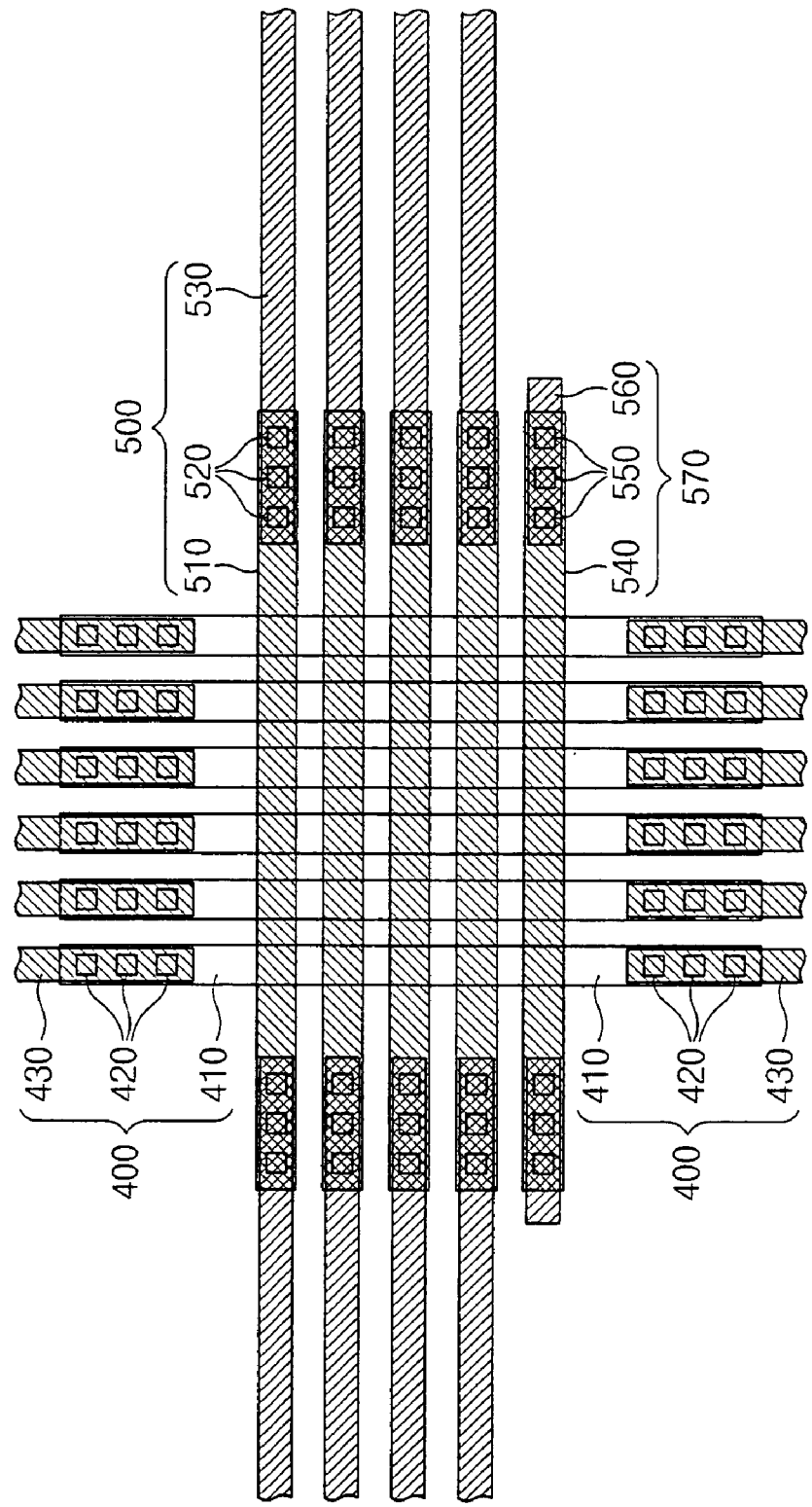

In addition, the upper interconnection structure 500 may have a similar structure to that of the junction block 600 described above with reference to FIGS. 4–7. For example, as illustrated in FIGS. 10 and 12, the upper interconnection structure 500 may have a parallel structure. Alternatively, as shown in FIGS. 11 and 13, the upper interconnection structure 500 may have a serial connection structure. In addition, as shown in FIG. 12 and 13, the upper interconnection structure 500 may include an upper dummy structure 570 including a dummy second trace 560, dummy second vias 550 and a dummy junction trace 540. The upper dummy structure 570 shown in FIG. 12 is connected in parallel, similar to that of FIG. 7A. In contrast, the upper dummy structure 570 shown in FIG. 13 is connected in series, similar to that of FIG. 6A.

Figure 14:
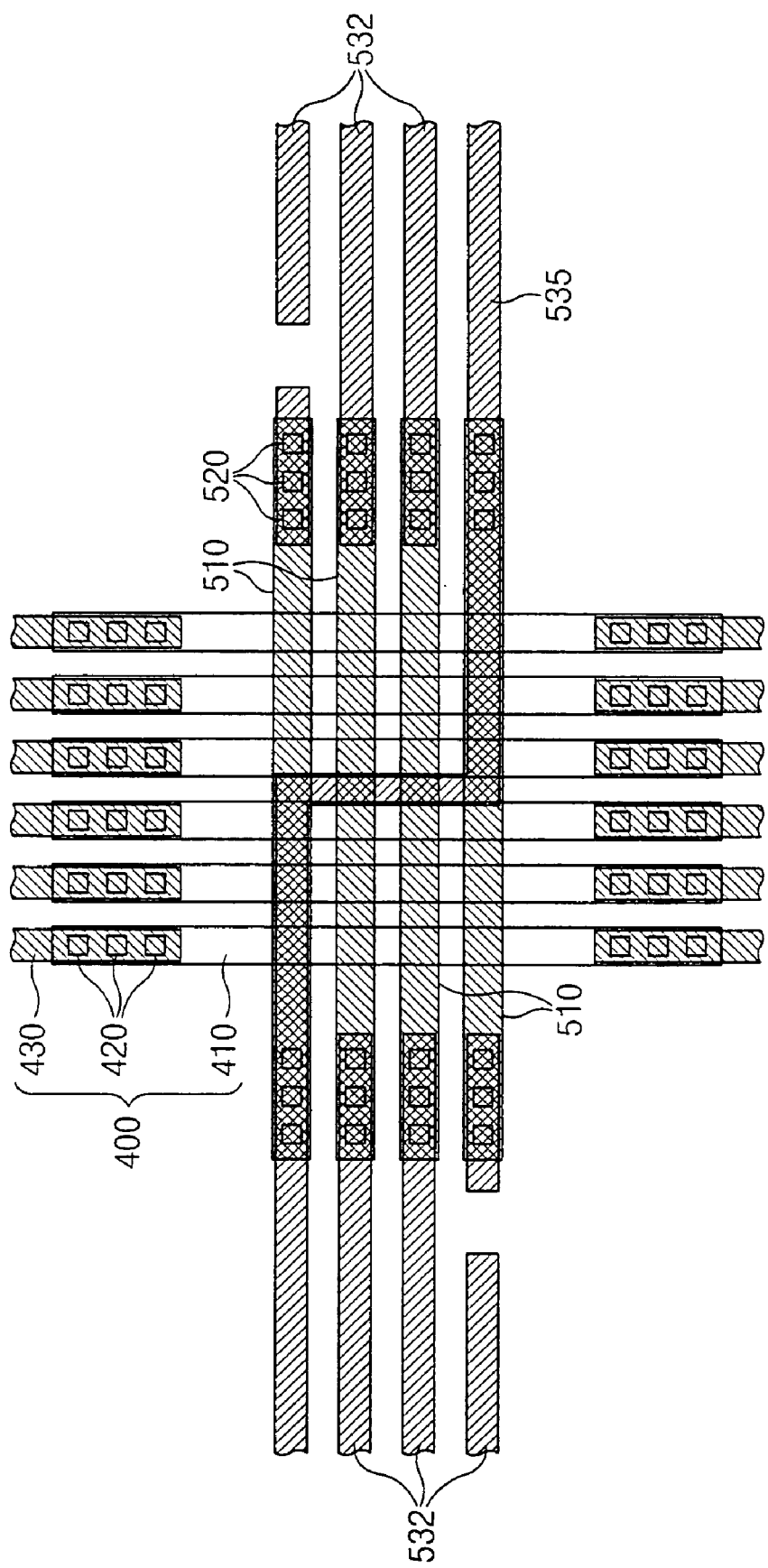

FIGS. 14 to 16 are schematic diagrams illustrating revised interconnection structures in semiconductor devices having three interconnection layers according to some embodiments of the present invention. Referring now to FIG. 14, the third traces 530 include left and right portions 532. In order to form a desired interconnection structure, a revised interconnection 535 is formed by connecting one of the left and right portions 532 of the third traces 530. The revised interconnection 535 is routed over the first junction traces 410 and the second junction traces 510. The revisions illustrated in FIG. 14 may be applicable to the embodiments described with reference to FIGS. 10 and 11.

Referring to FIG. 15, a revised interconnection structure which may be applicable to embodiments of the present invention having an upper dummy structure (such as the embodiments described with reference to FIGS. 12 and 13) is illustrated. As described in detail with reference to FIG. 9A, the upper dummy structure may be electrically floating, and as such, may provide an unused and/or a spare route for connecting the left and right portions 532 of the third traces 530, which may make it easier to revise the layout of the semiconductor device. As shown in FIG. 15, the revised interconnection 535 is routed on an unused area of the upper layer to cross over the first junction traces 410 and the second junction traces 510. Accordingly, methods of revision according to the present invention may be more efficient as compared with the prior art, as they can be accomplished by revising the routing of only the third traces 530.

Referring now to FIG. 16, some of the third traces 530 are disconnected from each other to form left and right portions 535 of the third traces 530. Two of the second traces 430 are then extended over the second vias 520, so that revised second interconnections 435 are electrically connected to two of the left and right portions 535 of the third traces 530. In addition, some of the second junction traces 510 (i.e. those routed where the revised second interconnections 435 are to be routed) are also disconnected, leaving hanging traces. As compared to the prior art, the embodiments of FIG. 16 may provide additional efficiency in revising the interconnection structures, as the second traces 430 and the third traces 530 may be re-routed without altering the layout of the second vias 520 and the lower interconnection structures 400.

According to some embodiments of the present invention, an interconnection structure including a lower metallization layer, a via layer and an upper metallization layer may be designed so as to include a trace junction block capable of providing dummy and/or alternate connection routes. In other words, the interconnection structure may be designed such that the junction traces are connected in series or in parallel with the traces on the upper metallization layer. Accordingly, it may be possible to form a revised interconnection structure by only altering the routing of the traces on the upper metallization layer, as opposed to conventional methods of revision, which may require revised routing on all three of the lower metallization layer, the via layer and the upper metallization layer. As such, the number of high-cost photomasks to be revised may be decreased, allowing for reduced costs in the development and production of semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. An integrated circuit device, comprising:
   a semiconductor substrate having an interlayer insulating layer thereon;
   a first junction block embedded in the interlayer insulating layer, said first junction block comprising:
      a first plurality of conductive junction traces located side-by-side within the interlayer insulating layer and a corresponding first plurality of pairs of conductive vias connected to opposite ends of respective ones of the first plurality of conductive junction traces; and
      a dummy conductive trace located adjacent the first plurality of conductive junction traces and a pair of dummy-conductive vias connected to opposite ends of the dummy conductive trace; and
   a plurality of upper metallization traces routed on the interlayer insulating layer, wherein the plurality of upper metallization traces are configured to electrically connect with respective ones of the first plurality of pairs of conductive vias and maintain the dummy conductive trace and the pair of dummy conductive vias in an unused and electrically floating condition, and wherein all of the first plurality of pairs of conductive vias remain connected to ones of the plurality of upper metallization traces irrespective of the routing of the plurality of upper metallization traces on the interlayer insulating layer.

2. The device of claim 1, wherein the plurality of upper metallization traces are configured to electrically connect with the first plurality of pairs of conductive vias such that at least one of the plurality of upper metallization traces is hanging and/or disconnected.

3. The device of claim 1, wherein the plurality of upper metallization traces are configured to electrically connect with the first plurality of pairs of conductive vias to form parallel connections between respective upper metallization traces and conductive junction traces.

4. The device of claim 1, wherein the plurality of upper metallization traces are configured to electrically connect with the first plurality of pairs of conductive vias to form series connections between respective upper metallization traces and conductive junction traces.

5. The device of claim 1, wherein multiple conductive vias are connected to opposite ends of respective ones of the first plurality of conductive junction traces.

6. The device of claim 1, wherein the first junction block further comprises a plurality of dummy conductive traces located adjacent the first plurality of conductive junction traces and a corresponding second plurality of pairs of conductive vias connected to opposite ends of respective ones of the plurality of dummy conductive traces, and wherein the plurality of upper metallization traces are further configured to maintain the plurality of dummy conductive traces and the second plurality of pairs of dummy conductive vias in an unused and electrically floating condition.

7. An interconnection structure of a semiconductor device comprising:
first and second interconnections arranged on a same layer and isolated from each other by an insulating material therebetween on the same layer;
via plugs connected to the first and second interconnections;
a subsidiary interconnection on a different layer and electrically connected to the first and second interconnections in series by the via plugs, wherein a conductive interconnection is not arranged between the first interconnection and the second interconnection on the same layer, and wherein all of the via plugs remain connected to the first and second interconnections irrespective of the routing of the first and second interconnections;
first and second dummy interconnections arranged at one side of the first and second interconnections;
dummy via plugs connected to the first and second dummy interconnections; and
a dummy subsidiary interconnection connected to the dummy via plugs,
wherein a dummy structure of the first and second dummy interconnections, the dummy via plugs and the dummy subsidiary interconnection are electrically insulated.

8. The interconnection structure of claim 7, further comprising:
a dummy interconnection arranged at one side of the first and second interconnections;
dummy via plugs further arranged at both ends of the dummy interconnection; and
a dummy subsidiary interconnection connected to the dummy via plugs, wherein a dummy structure of the dummy interconnection, the dummy via plugs and the dummy subsidiary interconnection are electrically insulated.

9. The interconnection structure of claim 7, wherein the subsidiary interconnection is electrically isolated except for the via plugs.

10. An interconnection structure of a semiconductor device comprising:
an interconnection having first and second positions and arranged on a first layer;
via plugs arranged at the first and second positions;
a subsidiary interconnection arranged on a second layer and connected to the interconnection in parallel by the via plugs;
a dummy interconnection arranged at one side of the interconnection;
dummy via plugs arranged at both ends of the dummy interconnection; and
a dummy subsidiary interconnection connected to the dummy via plugs, wherein a dummy structure of the dummy interconnection, the dummy via plugs and the dummy subsidiary interconnection are electrically insulated.

11. The interconnection structure of claim 10, further comprising:
first and second dummy interconnections being isolated with each other and arranged at one side of the interconnection;
dummy via plugs connected to the first and second dummy interconnections; and
a dummy subsidiary interconnection connected to the dummy via plugs, wherein a dummy structure of the first and second dummy interconnections, the dummy via plugs and the dummy subsidiary interconnection are electrically insulated.

12. The interconnection structure of claim 10, wherein the subsidiary interconnection is electrically isolated except for the via plugs.

* * * * *